United States Patent
Von Känel

(10) Patent No.: US 10,985,204 B2
(45) Date of Patent: Apr. 20, 2021

(54) STRUCTURES, SYSTEMS AND METHODS FOR ELECTRICAL CHARGE TRANSPORT ACROSS BONDED INTERFACES

(71) Applicant: G-ray Switzerland SA, Hauterive (CH)

(72) Inventor: Hans Von Känel, Wallisellen (CH)

(73) Assignee: G-ray Switzerland SA, Hauterive (CH)

( * ) Notice: Subject to any disclaimer, the term of this patent is extended or adjusted under 35 U.S.C. 154(b) by 163 days.

(21) Appl. No.: 16/077,756

(22) PCT Filed: Feb. 16, 2017

(86) PCT No.: PCT/IB2017/000120
§ 371 (c)(1),
(2) Date: Aug. 14, 2018

(87) PCT Pub. No.: WO2017/141103
PCT Pub. Date: Aug. 24, 2017

(65) Prior Publication Data
US 2019/0043914 A1    Feb. 7, 2019

Related U.S. Application Data

(60) Provisional application No. 62/295,720, filed on Feb. 16, 2016.

(51) Int. Cl.
*H01L 27/146* (2006.01)
*H01L 21/18* (2006.01)
(Continued)

(52) U.S. Cl.
CPC ...... *H01L 27/14661* (2013.01); *H01L 21/187* (2013.01); *H01L 21/3003* (2013.01);
(Continued)

(58) Field of Classification Search
CPC combination set(s) only.
See application file for complete search history.

(56) References Cited

U.S. PATENT DOCUMENTS 4,751,191 A * 6/1988 Gonsiorawski ..... H01L 21/3185
438/72
5,207,864 A    5/1993 Bhat et al.
(Continued)

FOREIGN PATENT DOCUMENTS

EP    2355134 A1    8/2011
FR    2849268    *    6/2004    ............ H01L 21/20
(Continued)

OTHER PUBLICATIONS

English translation, Tsunai, Japanese Pat. Pub. No. JP 2014-107448, translation date: May 2020, Schreiber Translations, Inc., all pages. (Year: 2020).*

(Continued)

*Primary Examiner* — Victoria K. Hall
(74) *Attorney, Agent, or Firm* — Da Vinci Partners LLC; John Moetteli

(57) ABSTRACT

Oxide-free, low temperature wafer bonding permits electric current to cross the covalently bonded interface unimpeded by traps, recombination centers and unintentional, defect-induced blocking barriers when interfacial defects are passivated by hydrogen diffused from shallow implants towards the interface. Systems and methods comprising oxide-free, low temperature covalent wafer bonding with passivated interface states are used in various applications requiring reduced interfacial scattering and carrier trapping and efficient charge collection across bonded interfaces.

29 Claims, 7 Drawing Sheets before bonding        after bonding        after annealing

(51) Int. Cl.
  *H01L 21/30* (2006.01)
  *H01L 21/762* (2006.01)
  *H01L 21/324* (2006.01)
(52) U.S. Cl.
  CPC ...... *H01L 21/324* (2013.01); *H01L 21/76254* (2013.01); *H01L 27/1469* (2013.01); *H01L 27/14634* (2013.01); *H01L 27/14636* (2013.01); *H01L 27/14687* (2013.01)

(56) References Cited

U.S. PATENT DOCUMENTS

| | | | |
|---|---|---|---|
| 5,308,950 A | 5/1994 | Ramm et al. | |
| 5,421,953 A * | 6/1995 | Nagakubo | B29C 59/14 156/272.2 |
| 5,451,547 A * | 9/1995 | Himi | H01L 21/187 438/455 |
| 5,877,070 A * | 3/1999 | Goesele | H01L 21/76251 117/915 |
| 6,150,239 A * | 11/2000 | Goesele | H01L 21/76251 438/458 |
| 6,352,909 B1 * | 3/2002 | Usenko | H01L 21/2236 438/458 |
| 6,534,380 B1 * | 3/2003 | Yamauchi | H01L 21/76254 257/E21.568 |
| 6,563,133 B1 * | 5/2003 | Tong | H01L 21/02052 257/347 |
| 6,787,885 B2 | 9/2004 | Esser et al. | |
| 6,808,967 B1 * | 10/2004 | Aspar | H01L 21/76245 438/162 |
| 6,995,075 B1 * | 2/2006 | Usenko | H01L 21/26506 438/458 |
| 7,008,859 B2 * | 3/2006 | Letertre | H01L 21/2258 257/E21.152 |
| 7,148,124 B1 * | 12/2006 | Usenko | H01L 21/76254 438/458 |
| 9,349,861 B1 * | 5/2016 | Cheng | H01L 29/1054 |
| 9,735,045 B2 * | 8/2017 | Ishizuka | H01L 21/02329 |
| 9,761,479 B2 * | 9/2017 | Imaoka | H01L 21/76251 |
| 10,065,395 B2 * | 9/2018 | Matsushita | B32B 9/04 |
| 10,163,957 B2 * | 12/2018 | Von Kanel | H01L 27/14689 |
| 10,561,382 B2 * | 2/2020 | Meylan | A61B 6/482 |
| 2001/0014514 A1 * | 8/2001 | Geusic | H01L 21/187 438/455 |
| 2002/0024152 A1 * | 2/2002 | Momoi | H01L 21/3226 257/347 |
| 2002/0055207 A1 * | 5/2002 | Kunii | H01L 29/78621 438/151 |
| 2004/0038504 A1 * | 2/2004 | Ito | H01J 37/08 438/520 |
| 2004/0171196 A1 * | 9/2004 | Walitzki | H01L 21/76254 438/137 |
| 2004/0188792 A1 * | 9/2004 | Brissot | H01L 31/02162 257/440 |
| 2004/0248380 A1 * | 12/2004 | Aulnette | H01L 21/76254 438/459 |
| 2004/0251477 A1 * | 12/2004 | Pourquier | H01L 27/14645 257/225 |
| 2004/0266052 A1 * | 12/2004 | Pourquier | H01L 31/1892 438/68 |
| 2005/0032265 A1 * | 2/2005 | Pourquier | H01L 31/02162 438/48 |
| 2006/0021565 A1 * | 2/2006 | Zahler | H01L 31/0288 117/89 |
| 2006/0060943 A1 * | 3/2006 | Ben Mohamed | H01L 21/26506 257/607 |
| 2006/0063353 A1 * | 3/2006 | Akatsu | H01L 21/3223 438/455 |
| 2006/0237744 A1 * | 10/2006 | Shahedipour-Sandvik | H01L 21/02381 257/190 |
| 2006/0284250 A1 * | 12/2006 | Hsu | H01L 21/84 257/347 |
| 2007/0072391 A1 * | 3/2007 | Pocas | H01L 21/187 438/455 |
| 2007/0246752 A1 * | 10/2007 | Cheng | H01L 29/66636 257/288 |
| 2007/0281445 A1 * | 12/2007 | Nguyen | H01L 21/76254 438/465 |
| 2008/0006369 A1 * | 1/2008 | Lim | C09J 5/02 156/308.6 |
| 2008/0034335 A1 * | 2/2008 | Cheng | H01L 29/66772 257/506 |
| 2008/0112448 A1 * | 5/2008 | Ueda | H01S 5/32341 372/44.011 |
| 2008/0149928 A1 * | 6/2008 | Moriguchi | H01L 21/76256 257/49 |
| 2008/0258181 A1 * | 10/2008 | Cannon | H01L 21/84 257/255 |
| 2008/0258222 A1 * | 10/2008 | Cannon | H01L 21/76264 257/351 |
| 2009/0081849 A1 * | 3/2009 | Yamazaki | H01L 21/2658 438/458 |
| 2009/0206441 A1 * | 8/2009 | Zhu | H01L 21/76254 257/506 |
| 2010/0148261 A1 * | 6/2010 | Fukushima | H01L 21/84 257/349 |
| 2010/0183885 A1 * | 7/2010 | Sato | B41J 2/1623 428/446 |
| 2010/0283104 A1 * | 11/2010 | Tada | H01L 27/1266 257/347 |
| 2011/0097873 A1 * | 4/2011 | Lee | H01L 21/76254 438/458 |
| 2011/0212598 A1 * | 9/2011 | Ishizuka | H01L 21/76254 438/458 |
| 2012/0138945 A1 * | 6/2012 | Chen | H01L 21/76254 257/76 |
| 2013/0089966 A1 * | 4/2013 | Qin | H01L 21/68735 438/457 |
| 2014/0038392 A1 * | 2/2014 | Yonehara | B81C 1/0038 438/463 |
| 2016/0104622 A1 * | 4/2016 | Oefner | H01L 29/66348 257/758 |
| 2017/0055923 A1 * | 3/2017 | Meylan | A61B 6/4085 |
| 2017/0373110 A1 * | 12/2017 | Von Kanel | H01L 21/76251 |
| 2018/0240842 A1 * | 8/2018 | Meylan | H01L 27/14636 |
| 2019/0172860 A1 * | 6/2019 | Von Kanel | H01L 27/14694 |

FOREIGN PATENT DOCUMENTS

| | | | |
|---|---|---|---|
| FR | 2849268 A1 | 6/2004 | |
| JP | 2014-107448 | * 6/2014 | .......... H01L 27/146 |
| JP | 2014107448 A | 6/2014 | |
| WO | WO2016097850 A | 6/2016 | |

OTHER PUBLICATIONS

English translation, Letertre, French Pat. Pub. No. FR 2849268, translation date: May 2020, Schreiber Translation, Inc., all pages. (Year: 2020).*

Rolf Kaufmann:"Singe Photon Imaging—From X-rays to Visible light", FEE 2011—8th intern. meeting on Front-End Electronics, May 1, 2011, XP055257552, Bergamo, Italy; p. 16.

Tong Q-Y et al: "Semiconductor wafer bonding: recent developments"; XP024148341, Mar. 1, 1994, whole document.

J.I. Pankove et al: "Amorphous silicon as a passivant for crystalline silicon", Jan. 15, 1979, whole document.

Q.-Y. Tong et al: "Hydrophobic silicon wafer bonding", Jan. 31, 1994, whole document.

Alin Mihaiu Fecioru et al: Silicon layer transfer by hydrogen implantation combined with wafer bonding in ultrahigh vacuum, Nov. 8, 2006, whole document.

A. Talneau et al: "Atomic-plane-thick reconstruction across the interface during heteroepitaxial bonding on InP-clad quantum wells on silicon", May 28, 2013, whole document.

(56) References Cited

OTHER PUBLICATIONS

J. Burggraf et al: "Monolithic thin wafer stacking using low temperature direct bonding", 2014, whole document.

C. Flötgen et al: "Novel surface preparation methods for covalent and conductive bonded interfaces fabrication", 2014, whole document.

Raymond S. Pengelly et al: "A review of GaN on SiC high electron-mobility power transistors and MMICs", Jun. 6, 2012, whole document.

T. Akatsu et al: Dislocation structure in low-angle interfaces between bonded Si(001) wafers.

A. Dommann et al, "X-ray curve characterization of homo-epitaxial layers on silicon deposited after DC hydrogen cleaning", Dec. 12, 1994, whole document.

J. W. Matthews et al: "Accomodation of misfit across the interface between cystals of semiconducting elements or compounds", Aug. 1970, whole document.

Stefan Bengtsson et al: "Interface charge control of directly bonded silicon structures", Aug. 1, 1989, whole documents.

I.P. Ferain et al: "Low temperature exfoliation process in hydrogen-implanted germanium layers", Mar. 9, 2010, whole document.

T. Plach et al: "Mechanism for room temperature direct wafer bonding", Mar. 7, 2013, whole document.

Hideki Takagi et al: "Transmission electron microscope observations of Si/Si interface bonded at room temperature by Ar Beam Surface Activation", 1999, whole document.

M.M.R. Howlader et al: "Investigation of the bonding strength and interface current of p-Si/n-GaAs wafers bonded by surface activated bonding at room temperature", 2001, whole.

A. Reznicek et al: Comparative TEM study of bonded silicon/silicon interfaces fabricated by hydrophilic, hydrophobic and UHV wafer bonding, 2003, whole document.

Sima Dimitrijev et al: "Advances in SiC power MOSFET technology", 2003, whole document.

Jürgen Michel et al: "High-performance Ge-on-Si photodetectors", Jul. 30, 2010, whole document.

Tingting Jiang et al: "Hydrogenation of interface states at a clean grain boundary in the direct silicon bonded wafer", Feb. 1, 2012, whole document.

Anton Loshachenko et al: Impact of hydrogen on electrical levels and luminescence of dislocation network at the interface of hydrophilically bonded silicon wafers, Dec. 11, 2012.

P. Gupta et al: "Hydrogen desorption kinetics from monohydride and dihydride species on silicon surfaces", May 15, 1988, whole document.

G.W. Trucks et al: "Mechanism of HF Etching of silicon surfaces: A theoretical unterstanding of Hydrogen Passivation", Jul. 23, 1990, whole document.

Katsuaki Tanabe et al: "III-V/Si hybrid photonic devices by direct fusion bonding", Apr. 2, 2012, whole document.

Mark R: Tesauro et al: Removal of hydrogen from 2H::Si(100) by sputtering and recoil implantation: investigation . . . , 1998, whole document.

J. Ramm et al: "Hydrogen cleaning of silicon wafers. Investigation of the wafer surface after plasma treatment", 1993, whole document.

International Search Report, International patent application No. PCT/IB2017/000120, dated May 11, 2017.

\* cited by examiner

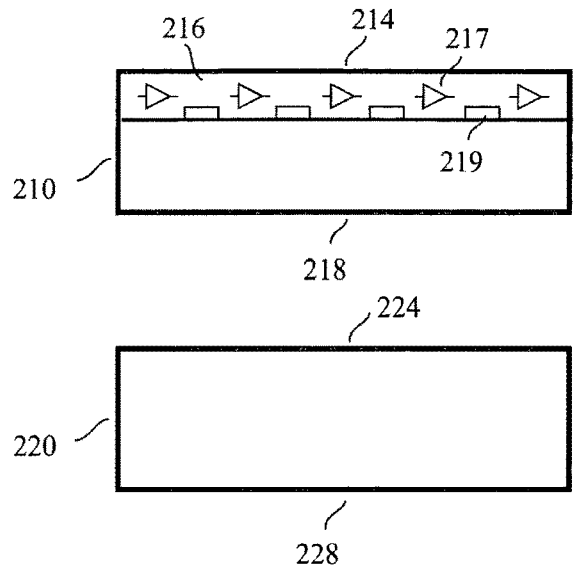
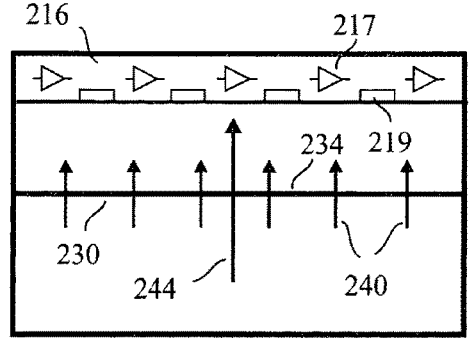
before bonding       after bonding
FIG. 2A
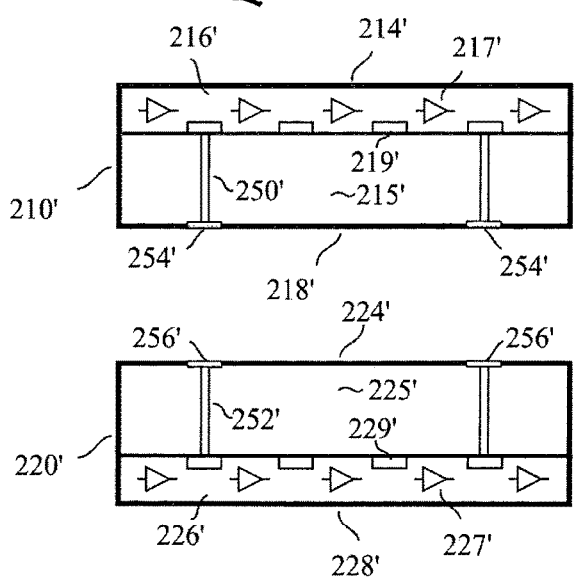
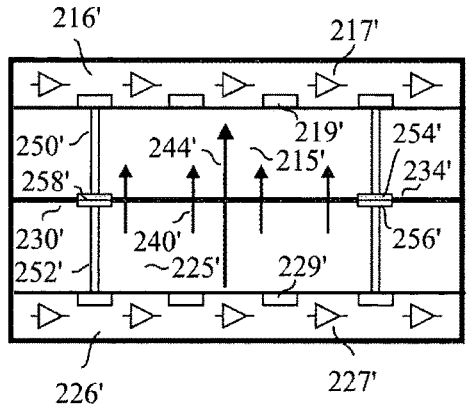
before bonding       after bonding
FIG. 2B

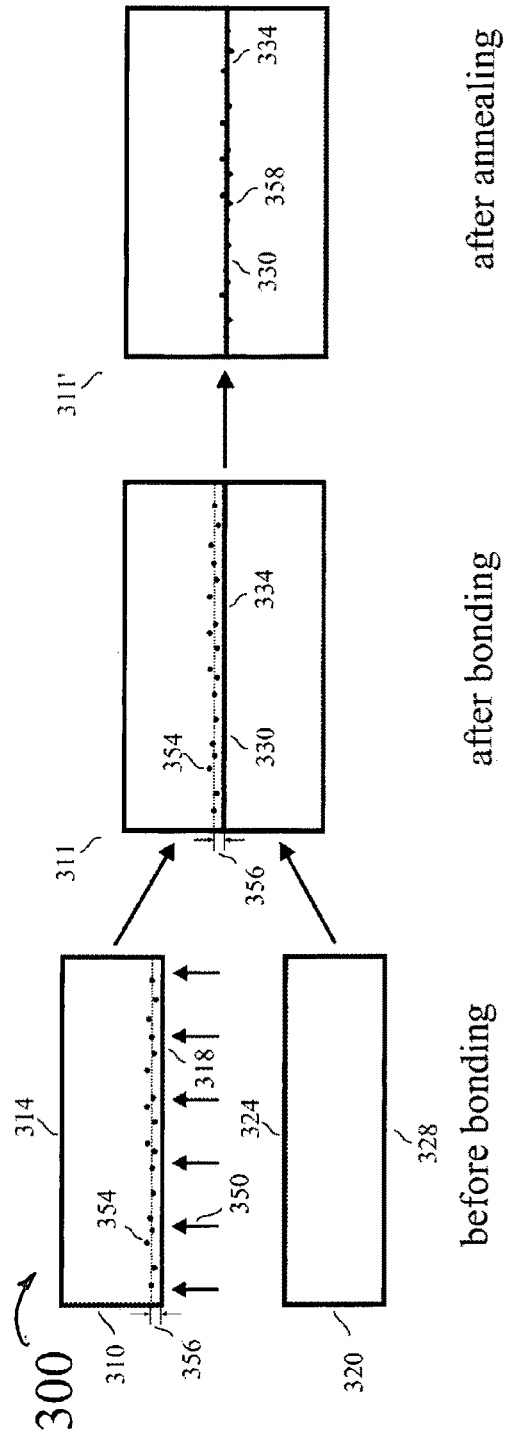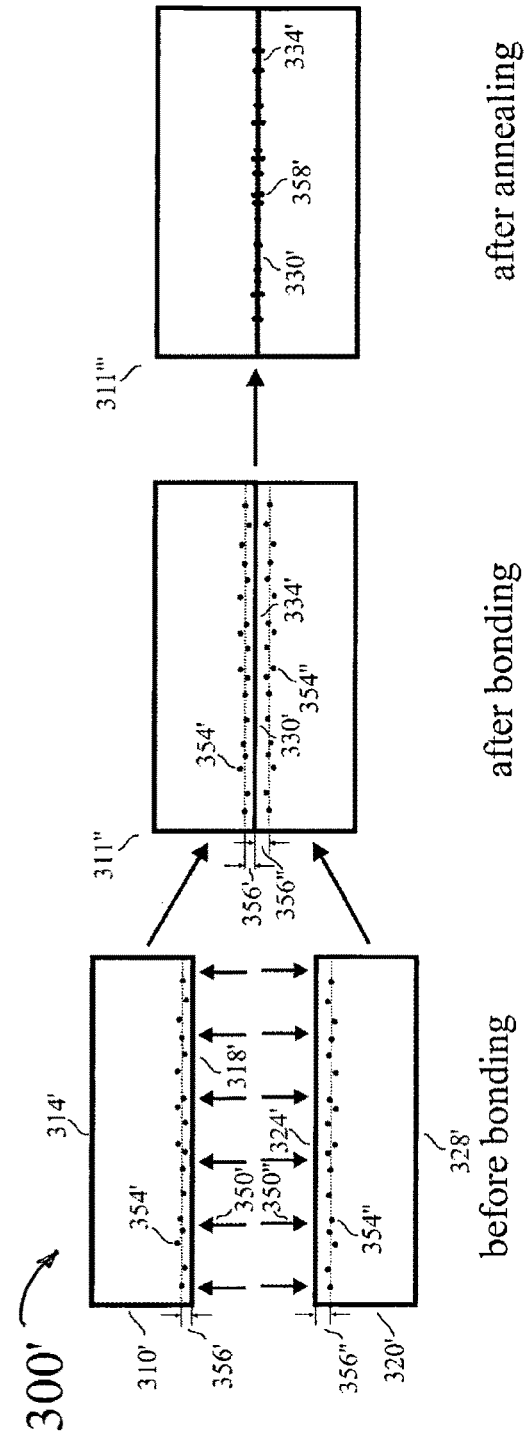

STRUCTURES, SYSTEMS AND METHODS FOR ELECTRICAL CHARGE TRANSPORT ACROSS BONDED INTERFACES

CROSS REFERENCE TO RELATED APPLICATIONS

This application is the National Stage of International Application No. PCT/IB2017/000120, filed Feb. 16, 2017, which claims benefit under 35 USC § 119(a), to U.S. provisional patent application Ser. No. 62/295,720, filed Feb. 16, 2016.

FIELD OF THE INVENTION

The invention relates to structures designed for electrical charge transport across low-temperature bonded semiconductor interfaces unimpeded by unintentional interfacial blocking layers and defects, to methods providing the same, and to systems in which such structures are applied.

BACKGROUND OF THE INVENTION

Direct bonding of semiconductor wafers is becoming a versatile technique for the combination of different functionalities in a compact, monolithic unit. Especially oxide-free bonding has recently been shown to provide interfaces of superior quality in comparison with epitaxial growth, where threading dislocations forming during the plastic relaxation of misfit stress very often degrade lattice mismatched device layers (see for example Matthews et al., in J. Appl. Phys. 41, 3800 (1970), the entire disclosure of which is hereby incorporated by reference). In direct wafer bonding, dislocations are exclusively located at the bonded interface irrespective of the lattice mismatch of the bonding partners. For example, the ability to form monolithic structures of compound semiconductors bonded to silicon substrates has a significant potential for Si photonics and high efficiency multi-junction solar cells and other applications, provided that the bonding process is carried out at low temperatures in order to avoid mechanical stress developing because of different thermal expansion coefficients of the bonding partners. Recent examples of hybrid III-V/Si photonic devices based on low temperature, oxide-free direct bonding of GaAs on Si, where the lattice parameter mismatch amounts to 4%, have for example been described by K. Tanabe et al. in Sci. Rpts. 2, 349 (2012), the entire disclosure of which is hereby incorporated by reference.

Successful oxide-free bonding of InP to Si has been demonstrated as well despite the lattice parameter mismatch which in this case is even as large as 8.1% (see for example A. Talneau et al. in Appl. Phys. Lett. 102, 212101 (2013), the entire disclosure of which is hereby incorporated by reference).

The application of direct, oxide-free wafer bonding to high-resolution, high-sensitivity particle and X-ray imaging detectors has been described for example by von Känel in the International Patent Application No. WO 2016/097850, the entire disclosure of which is hereby incorporated by reference.

Such wafer bonding requires exceptionally smooth surfaces with a roughness typically below one nanometre, achievable for example by chemical mechanical polishing. In addition, the wafer surfaces have to be oxide-free prior to bonding. Especially if one or both of the bonding partners has undergone device processing, such as CMOS processing, not only the bonding but also the oxide removal needs to be carried out at low temperature, typically below 300° C.-400° C. or preferably below 300° C. or even below 200° C.

There are mainly two methods available for the removal of surface oxides at low temperatures. The first method includes dry etching or sputtering and subsequent transfer of the clean wafers in ultra-high vacuum ("UHV") to the bonding chamber. Ultra-high vacuum is the vacuum regime characterized by pressures lower than about $10^{-7}$ pascal or 100 nanopascals ($10^{-9}$ mbar, ~$10^{-9}$ torr). UHV requires the use of unusual materials for equipment, and heating of the entire system above 100° C. for many hours ("baking") to remove water and other trace gases which adsorb on the surfaces of the chamber. At these low pressures the mean free path of a gas molecule is approximately 4 km, so gas molecules will collide with the chamber walls many times before colliding with each other. Almost all interactions therefore take place on various surfaces in the chamber. Room temperature bonding under UHV conditions was originally tested on small samples for example by H. Takagi et al. in Jap. J. Appl. Phys. 38, 1589 (1999), and by M. M. R. Howlader et al. in J. Vac. Sci. Technol. B 19, 2114 (2001), the entire disclosures of which are hereby incorporated by reference. More recently, the application of oxide removal by dry etching to oxide-free bonding at the scale of 200 mm wafers has been demonstrated by C. Flötgen et al. in ECS Transactions 64, 103 (2014), the entire disclosure of which is hereby incorporated by reference. Since such dry etching processes involve surface bombardment by energetic particles, they inevitably lead to some surface amorphization and consequently to an amorphous interfacial region after bonding with a thickness of typically a few nanometres (see for example H. Takagi et al. in Jap. J. Appl. Phys. 38, 1589 (1999); M. M. R. Howlader et al. in J. of Vac. Sci. Technol. 19, 2114 (2001); C. Flötgen et al. in ECS Transactions 64, 103 (2014), the entire disclosures of which are hereby incorporated by reference). One of the consequences of amorphous interfaces is the presence of dangling bonds which may act as carrier traps and recombination centers and lead to Fermi level pinning. The electrical transport properties across such a bonded interface may hence be non-ideal even when it is oxide-free (see for example S. Bengtsson et al. in J. Appl. Phys. 66, 1231 (1989); M. M. R. Howlader et al. in J. Vac. Sci. Technol. 19, 2114 (2001), the entire disclosures of which are hereby incorporated by reference).

The second method for removing surface oxides is by wet chemical etching, usually in a dilute HF bath. Silicon surfaces become hydrogen passivated by such a treatment, so that re-oxidation happens slowly even in air (see for example G. W. Trucks et al. in Phys. Rev. Lett. 65, 504 (1990), the entire disclosure of which is hereby incorporated by reference). The bonding process between two H-terminated wafers is called hydrophobic bonding. It results, however, in very weak bonds and therefore needs to be followed by post-bonding annealing in order to drive off the interfacial hydrogen and to establish covalent bonds. Unfortunately, post-bonding annealing frequently leads to the formation of undesirable hydrogen bubbles at the interface even at temperatures as low as 300° C. The temperature at which hydrogen bubbles form can be reduced further when the annealing is carried out for sufficiently long times. Reaching bulk fracture strengths requires annealing temperatures on the order of 700° C. (see for example Q.-Y. Tong et al. in Appl. Phys. Lett. 64, 625 (1994), the entire disclosure of which is hereby incorporated by reference). Bubble formation during the annealing of hydrophobically bonded Si wafers can be avoided for example by providing escape paths in the form of grooves for the hydrogen to escape (see for example U.S. Pat. No. 6,787,885 to Esser, the entire disclosure of which is hereby incorporated by reference). However, Esser is not suitable for applications in which the whole bonded interface area needs to be electrically conducting. In the instant disclosure, an electrically conducting interface is defined as an interface across which charge carriers can flow freely. In other words, it is not an electrically conducting plane such as a metallic sheet. In the absence of wafer patterning, the only way of avoiding hydrogen bubbles and forming strong covalent bonds even at room temperature seems to be to drive off the surface hydrogen before the bonding by some means and to perform the bonding in UHV. The most common method of hydrogen removal from a passivated Si surface is thermal desorption, starting at about 370° C. for $SiH_2$ species and 450° C. for SiH species (see for example P. Gupta et al. in Phys. Rev. B 37, 8234 (1988), the entire disclosure of which is hereby incorporated by reference). Since an annealing temperature of 450° C. is already too high for most CMOS processed wafers, it is preferable to desorb the hydrogen by other means, such as photo-thermal desorption (see for example A. M. Fecioru et al. in Appl. Phys. Lett. 89, 192109 (2006), the entire disclosure of which is hereby incorporated by reference) or He ion bombardment (see for example M. R. Tesauro et al. in Surf. Sci. 415, 37 (1998), the entire disclosure of which is hereby incorporated by reference).

Oxide-free Si—Si interfaces obtained by bonding and subsequent annealing are characterized by the formation of a dense interfacial dislocation network because of inevitable wafer twist and tilt (see for example A. Reznicek et al. in Mat. Chem. Phys. 81, 277 (2003), and T. Akatsu et al. in J. Mat. Sci. 39, 3031 (2004), the entire disclosures of which are hereby incorporated by reference). Even in the absence of oxygen and amorphous layers, bonded interfaces are therefore not defect-free, since dislocations are usually associated with deep traps and recombination centers which affect the optical and electrical properties. In order to minimize the effect of interfacial defects on the electrical transport across bonded interfaces, the surfaces of the bonding partners are therefore usually heavily doped (see for example US Patent Application No. 2006/0021565 to Zahler, the entire disclosure of which is hereby incorporated by reference). Alternatively, the detrimental effect of such defects can be minimized for example by hydrogen passivation. Passivation of dangling bonds on crystalline-Si surfaces by a hydrogenated amorphous Si layer was demonstrated long ago (see for example J. I. Pankove et al. in Appl. Phys. Lett. 34, 156 (1979), the entire disclosure of which is hereby incorporated by reference). A similar effect was observed on bonded Si wafers subjected to annealing above 1000° C. to reveal the dislocation network and to subsequent hydrogen diffusion (see for example A. Loshachenko et al. in Phys. Stat. Sol. C 10, 36 (2013), and T. Jiang et al. in Phys. Stat. Sol. A 209, 990 (2012), the entire disclosures of which are hereby incorporated by reference).

There is a need for low temperature, covalent wafer bonding permitting electric charge transport across the bonded interface unimpeded by traps, recombination centers, defect-related potential barriers and associated band bending.

There is a need for oxide-free wafer bonding at low temperatures compatible with CMOS processed wafers providing electrical transport properties unaffected by unintentional interfacial barriers and associated band bending as well as traps and recombination centers.

There is especially a need for charge collection across oxide-free wafer bonds which is unaffected by interfacial scattering, charge carrier trapping and carrier recombination for wafers of any doping level including undoped wafers.

SUMMARY OF THE INVENTION

The invention teaches structures and fabrication methods for the formation especially of covalently bonded wafers permitting electrical current transport across the bonded interface unimpeded by traps, recombination centers and other defects which may lead to unintentional potential barriers and associated band bending. Low processing temperatures permit the use of thermally mismatched and pre-processed bonding partners. Efficient charge collection across the bonded interfaces is established by passivating interfacial defects by means of shallow hydrogen implants prior to bonding.

It is the aim of this invention to eliminate the negative effect of unintentional, defect-related potential barriers and of traps and recombination centers on the electric transport properties both parallel and perpendicular to the interface between covalently bonded wafer pairs and irrespective of their doping level. All structures and processes are executed at low temperatures in order to permit for example the bonding of wafers exhibiting a large mismatch of the thermal expansion coefficients, or of wafers which have undergone all levels of device processing including metallization. The invention applies for example to high efficiency multiple-junction solar cells of III-V semiconductors bonded to silicon wafers, to electrical power devices integrated with Si driver electronics, to CMOS-integrated elementary particle imaging detectors, to high-resolution single-photon medium to high energy X-ray imaging detectors as well as to detectors for low energy electromagnetic radiation from millimetre waves through infrared, optical, and ultraviolet wavelengths to the soft X-ray regime.

It is an object of the invention to provide structures and methods suitable for the unimpeded collection of electrical charges crossing bonded semiconductor interfaces without the need of high doping leading to tunnelling through narrow space charge layers.

It is another object of the invention to provide structures and methods suitable for electrical transport unaffected by unintentional, defect-related barriers and associated band bending across bonded semiconductor interfaces formed at temperatures compatible with fully CMOS processed wafers.

It is yet another object of the invention to provide structures and methods suitable for the elimination of scattering of charge carriers either propagating parallel to or crossing bonded semiconductor interfaces. It is a further object of the invention to provide structures and methods suitable for the passivation of interfacial defects formed during oxide-free, low temperature covalent wafer bonding.

In an advantage, oxide-free, low temperature wafer bonding permits electric current to cross the covalently bonded interface unimpeded by traps, recombination centers and unintentional, defect-induced blocking barriers and associated band bending when interfacial defects are passivated by hydrogen diffused from shallow implants towards the interface.

In another advantage, systems and methods for oxide-free, low temperature wafer covalent bonding may be used in various applications requiring efficient charge collection across bonded interfaces.

These and other objects of the invention are described in the drawings, specification and claims.

BRIEF DESCRIPTION OF THE DRAWINGS

FIG. 2A is a scheme of a processed wafer with electronic circuits and a second wafer, before and after low temperature oxide-free wafer bonding.

FIG. 2B is a scheme of two processed wafers with electronic circuits, before and after low temperature, oxide-free wafer bonding.

FIG. 3A is a graph showing a wafer with a hydrogen implant and a second wafer, before and after low temperature, oxide-free wafer bonding followed by a low temperature anneal.

FIG. 3B is a graph showing two wafers with hydrogen implants before and after low temperature, oxide-free wafer bonding followed by a low temperature anneal.

DETAILED DESCRIPTION OF THE PREFERRED EMBODIMENTS

In essence, the method of the invention reduces defect-induced interfacial potential barriers at the covalently bonded interface between two semiconductor wafers. Such method forms a covalently bonded wafer pair and includes the steps of creating a shallow (1-500 nm depth)hydrogen implant in at least one wafer before bonding, and annealing the bonded wafers at low (100 degrees C.-400 degrees C.) temperature so that implanted hydrogen diffuses to the bonded interface.

The method includes the step of removing the surface oxides from the surfaces of both wafers before bonding, the method passivating traps and recombination centers and reducing defect-induced interfacial potential barriers at a covalently bonded interface between two covalently bonded semiconductor wafers to permit electric current to flow unimpeded across the bonded interface.

Figure 1:
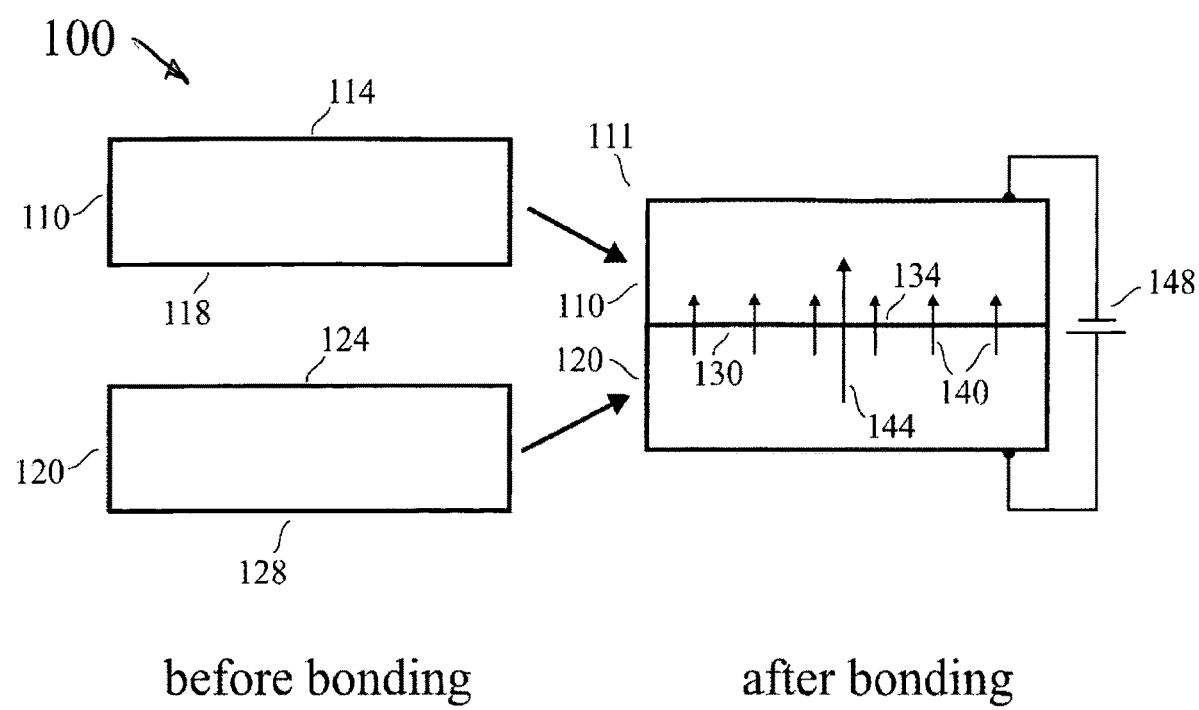
FIG. 1 is a scheme of two wafers before and after low temperature, oxide-free wafer bonding.

Referring now to FIG. 1, generic embodiment 100 of structures made up of direct, oxide-free bonded wafer pair 111 may include wafer 110 which may be nominally undoped or doped to a level within a range of levels comprising for example $10^{11}$-$10^{12}$, $10^{12}$-$10^{13}$, $10^{13}$-$10^{14}$, $10^{14}$-$10^{15}$, $10^{15}$-$10^{16}$, $10^{16}$-$10^{17}$, $10^{17}$-$10^{18}$, $10^{18}$-$10^{19}$, and $10^{19}$-$10^{20}$ cm$^{-3}$. Wafer 110 has upper surface 114 and planar, smooth lower surface 118 with a roughness on the order of 0.5 nm before the bonding. Bonded wafer pair 111 may further include wafer 120 which may be nominally undoped or doped to a level within a range of levels comprising for example $10^{11}$-$10^{12}$, $10^{12}$-$10^{13}$, $10^{13}$-$10^{14}$, $10^{14}$-$10^{15}$, $10^{15}$-$10^{16}$, $10^{16}$-$10^{17}$, $10^{17}$-$10^{18}$, $10^{18}$-$10^{19}$, and $10^{19}$-$10^{20}$ cm$^{-3}$. Wafer 120 has planar, smooth upper surface 124 with a roughness on the order of 0.5 nm and lower surface 128 before the bonding. Surface 118 of wafer 110 and surface 124 of wafer 120 are activated by any means from a list of means comprising wet-chemical cleaning and passivation followed by the removal of the passivation layer for example by a low-energy plasma or laser desorption, plasma activation for example by a Ne, Ar, Xe, or N plasma to render the bonding surfaces oxide-free. Bonded wafer pair 111 including lower surface 118 of wafer 110 bonded to upper surface 124 of wafer 120 in low temperature covalent bond 130 is provided with means for electric current 140 to cross bonded interface 134 unimpeded by traps, recombination centers or unintentional, defect-related interfacial potential barriers and associated band bending, when electric field 144 is present generated for example by voltage 148 between wafers 110 and 120, or by any other means. Unintentional potential barriers and associated band bending at a bonded interface are for example caused by Fermi level pinning by interfacial defect states in the energy gap of bonded wafer pairs made up of wafers made of the same semiconductor material (for example Si wafers) and of the same doping type. A potential barrier present at the interface between two bonded n-doped Si wafers doped for example to $10^{13}$-$10^{15}$ cm$^{-3}$ or any other doping level would be unintentional, while a potential barrier between a n-doped and a p-doped Si wafer is considered to be intentional, since this is the well-known barrier present at a p-n junction. Likewise, the potential barrier at the ideal, defect-free interface between two wafers made from different materials but similar doping type is considered to be intentional, given by the characteristic band offset. For example the conduction band of GaAs would clearly lie higher in energy than the conduction band of Si in a covalent wafer bond between ideal Si and GaAs surfaces. In the absence of significant band bending electrons travelling from the GaAs side of an ideal bonded interface towards the Si side could therefore freely cross this interface while electrons travelling in the opposite direction would have to surmount a potential step. This is not the case, however, for defective interfaces at which electrons can for example be trapped or scattered.

Referring now to FIG. 2A, a first embodiment 200 of direct, oxide-free wafer bonding may include device 211 made up of electronic wafer 210 covalently bonded to wafer 220. Electronic wafer 210 with upper surface 214 and lower surface 218 may be a processed wafer for example with integrated electric circuits 216 made up of devices 217 connected by metal lines which may be arranged in various metallization and dielectric layers on upper surface 214. In addition, electronic wafer 210 may include charge collectors 219 communicating with electric circuits 216 to collect charges generated in wafer 220 with upper surface 224 and lower surface 228 in structures in which wafer 220 with upper surface 224 and lower surface 228 is a sensor wafer (also known as an absorber wafer). Wafer 210 may be a Si wafer acting purely as a mechanical support in bonded device structure 211. In addition wafer 210 may assume electrical or optoelectronic functions in the device, such as for example in a multi-junction solar cell structure. Alternatively, wafer 210 may have undergone full front end CMOS processing including the formation of the multi-layer metal and dielectric layer stack. Wafer 220 may for example be a highly resistive Si wafer with a resistivity for example above 1000 Ωcm or 1000-10,000 Ωcm or even 10,000-30,000 Ωcm when acting as a sensor wafer for elementary particle or soft X-ray detection in device structure 211. Wafer 220 may also be a $Si_{1-x}Ge_x$ alloy wafer with x in the range 0<x≤1, i.e. comprising a Ge content from close to zero up to pure Ge. The $Si_{1-x}Ge_x$ alloy wafer may be a bulk alloy wafer, or, alternatively, an epitaxial wafer, made up of an epitaxial $Si_{1-x}Ge_x$ alloy layer on a Si substrate. Wafer 220 may also be a SiC wafer or an epitaxial SiC wafer, comprising an epitaxial SiC layer on a Si substrate. Alternatively, wafer 220 may be a compound semiconductor wafer, comprising a compound semiconductor from a list of semiconductors, comprising for example GaAs, InP, $In_xGa_{1-x}As$ with 0<x51, $In_xGa_{1-x}As_{1-y}P_y$ with 0<x≤1 and 0<y≤1, CdTe, $Cd_{1-x}Zn_xTe$ with 0<x≤1. Wafer 220 may also be an epitaxial compound semiconductor wafer comprising at least one semiconductor layer from a list comprising GaAs, InP, $In_xGa_{1-x}As$ with 0<x≤1, $In_xGa_{1-x}As_{1-y}P_y$ with 0<x≤1 and 0<y≤1, CdTe, $Cd_{1-x}Zn_xTe$ with 0<x≤1 grown for example on a Si or a compound semiconductor substrate. Low temperature covalent wafer bond 230 provides oxide-free bonded interface 234 between lower surface 218 of wafer 210 and upper surface 224 of wafer 220.

Wafer bond 230 is provided with means permitting electric charges 240 to cross bonded interface 234 unimpeded by traps, recombination centers or unintentional, defect-related interfacial barriers and associated band bending, when electric field 244 is present, driving electric current across interface 234 in order to be collected by charge collectors 219 and further processed by electric circuits 216. Charge collectors 219 may for example define the pixels of a pixel detector to collect charges generated in absorber wafer 220 and crossing interface 234 to be processed and read out by readout circuits 216.

Referring now to FIG. 2B, a second embodiment 200' of direct, oxide-free wafer bonding may include device 211' made up of wafer 210' covalently bonded to wafer 220', both of which may have undergone device processing. Electronic wafer 210' with upper surface 214' and lower surface 218' may be a processed wafer for example with integrated electric circuits 216' comprising devices 217' connected by metal lines which may be arranged in various metallization and dielectric layers on upper surface 214'. In addition electronic wafer 210' may include charge collectors 219' communicating with electric circuits 216' to collect charges generated in wafer 220' in structures in which wafer 220' is a sensor wafer. Wafer 210' may for example be a Si wafer which has undergone full CMOS processing as known in the art. Electronic wafer 220' with upper surface 224' and lower surface 228' may optionally be a processed wafer for example with integrated electric circuits 226' comprising devices 227' connected by metal lines which may optionally be arranged in various metallization and dielectric layers on lower surface 228' and optional charge collectors 229' communicating with electric circuits 226'. In aspects of the embodiment, direct bonded wafer pairs 210', 220' may give rise to structures in which power electronics circuits are integrated with driver electronics on the same chip. In one aspect of the embodiment wafer 220' may for example be a SiC wafer which has undergone CMOS processing to provide power electronics devices such as power metal-oxide field-effect transistors (MOSFETs) (see for example S. Dimitrijev et al. in Microelectronics Reliability 43, 225 (2003), the entire disclosure of which is hereby incorporated by reference). In another aspect of the embodiment, wafer 220' may by a GaN wafer which has been processed into power electronics devices and circuits for example by means of high electron mobility transistors (HEMTs) based on AlGaN/GaN heterojunctions (see for example R. Pengelly et al. in IEEE Transactions on Microwave Theory and Techniques 60, 1764 (2012), the entire disclosure of which is hereby incorporated by reference). A GaN wafer may also be an epitaxial wafer comprising GaN and other group III nitride layers on a SiC, sapphire or Si substrate. In both power electronics applications based on either SiC or GaN, power electronics wafer 220' may communicate with wafer 210' containing the CMOS processed Si driver electronics for example by means of through-silicon-vias (TSVs) 250' extending through wafer 210' and being bonded to through-vias 252' extending through wafer 220' in a metal-to-metal bond. Instead of being bonded directly, these through-vias may be electrically communicating with metallic bond pads 254' on lower surface 218' of wafer 210' and corresponding metallic bond pads 256' on upper surface 224' of wafer 220'. In addition to covalent semiconductor-semiconductor bonds 230', embodiment 200' may therefore also contain metal-to-metal bonds 258' such as for example Cu—Cu bonds or Ni—Ni bonds.

Low temperature covalent wafer bond 230' provides oxide-free bonded interface 234' between lower surface 218' of wafer 210' and upper surface 224' of wafer 220'. Wafer bond 230' is provided with means to eliminate or passivate localized electronic defect states such as traps and recombination centers at bonded interface 234' which may give rise to unintentional, defect-related interfacial barriers and associated band bending affecting the functionality of device 211'. In other words, the functionality of semiconducting layer 215' of wafer 210' or that of semiconducting layer 225' of wafer 220' is not affected by the presence of defects at covalent bond 234'. This is the result of defect passivation at bonded interface 234' for example by hydrogen, by means of which carrier depletion in layers 215', 225' may be avoided and scattering reduced or eliminated. The reduction of scattering at bonded interface 234' may be important for example when layer 225' includes the high mobility layer of a HEMT. In an aspect of the embodiment, transport of charges 240' across bonded interface 234' may be required for example in the presence of electric field 244' in addition to the current crossing electrical connection 258' between wafers 210', 220', for example when wafer 220' is a sensor wafer. The elimination or passivation of localized electronic defect states may be equally important in this case.

Figure 2C:
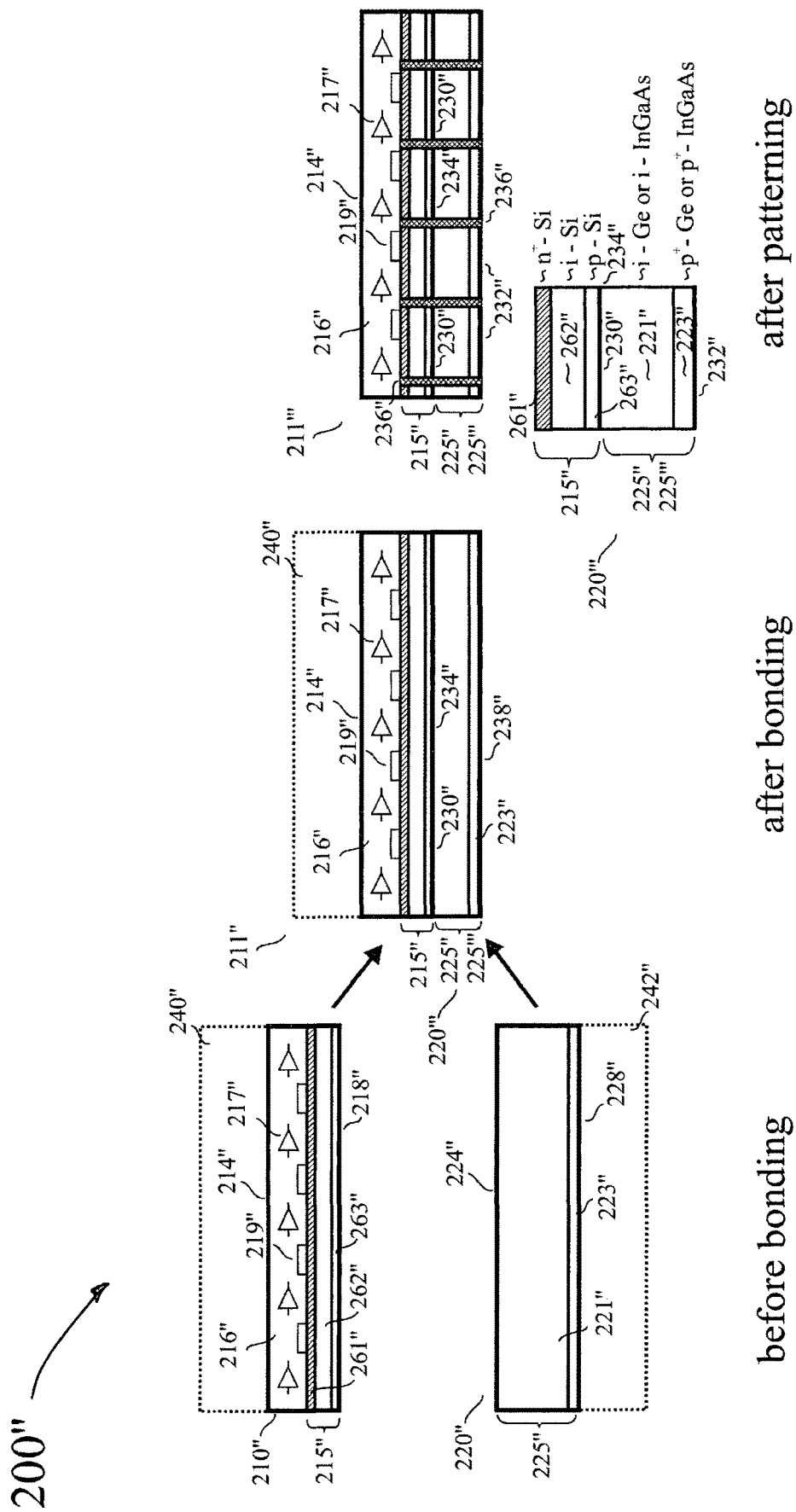
FIG. 2C is a scheme of a processed wafer with a layer stack and a second wafer with a layer stack before bonding, after bonding and after additional patterning of the layer stacks.

Referring now to FIG. 2C, third embodiment 200" of direct, oxide-free covalent wafer bonding may include the bonding of wafer 210" to wafer 220". Wafer 210" with upper surface 214" and lower surface 213" may be an electronic wafer for example with integrated electric circuits 216" comprising devices 217" connected by metal lines which may be arranged in various metallization and dielectric layers on upper surface 214". In addition electronic wafer 210" may include charge collectors 219" communicating with electric circuits 216" to collect charges generated in wafer 220" in structures in which wafer 220" is a sensor wafer. Wafer 210" may for example be a Si wafer, upper surface 214" of which has undergone CMOS processing. Opposite upper surface 214" wafer 210" may further include at least one layer from stack 215" made up of differently doped layers 261", 262", 263" the at least one layer having a doping type different from the doping of the body of wafer 210" (i.e. the CMOS processed substrate). Wafer 210" may optionally be a thinned wafer such as a silicon-on-insulator (SOI) wafer, the substrate and oxide box of which have been removed. It is understood that the fabrication of covalently bonded structures may involve the use of handling wafers 240", 242" wherever thin wafers need to be mechanically stabilized for example during thinning or during covalent bonding. Lower surface 218" of wafer 210" may optionally be implanted with a low dose of hydrogen before covalent bonding as a means to passivate electronic defect states to permit electric charges to cross bonded interface 234" unimpeded by traps, recombination centers or unintentional, defect-related interfacial barriers.

Wafer 220" with upper surface 224" and lower surface 228", 236" and 238" may be a wafer comprising at least one elemental and/or compound semiconductor layer from a stack 225" of semiconductor layers which may be differently doped, including for example $Si_{1-x}Ge_x$ with $0 \leq x \leq 1$, GaAs, InP, $In_xGa_{1-x}As$ with $0<x \leq 1$, $In_xGa_{1-x}As_{1-y}P_y$ with $0<x \leq 1$ and $0<y \leq 1$, CdTe, $Cd_{1-x}Zn_xTe$ with $0<x \leq 1$. Wafer 220' may also be an epitaxial semiconductor wafer comprising at least one semiconductor layer from stack 225" epitaxially grown on a Si or a compound semiconductor substrate which in this case may also act as handling wafer 242". Wafer 220" may for example be a Ge wafer with intrinsic layer 221" and optional, highly doped cap layer 223". Upper surface 224" may optionally be implanted by hydrogen to permit low temperature layer splitting after covalent bonding (see for example I. P. Ferain et al. in J. Appl. Phys. 107, 054315 (2010), the entire disclosure of which is hereby incorporated by reference). Wafer 220" may also be an epitaxial Ge wafer, made up of a Ge layer epitaxially grown on a Si substrate acting also as handling wafer 242". Optionally the Ge layer may include an undoped Ge layer 221" on top of a highly doped Ge contact layer 223". Alternatively, wafer 220" may be an epitaxial wafer made up of an epitaxial $In_xGa_{1-x}As$ layer which may equally include an undoped layer on top of a highly doped contact layer, for example, on a GaAs substrate acting also as a handling wafer 242". Optionally, upper surface 224" of wafer 220" may be implanted with a low dose of hydrogen before covalent bonding as a means to passivate electronic defect states to permit electric charges to cross bonded interface 234" unimpeded by traps, recombination centers or unintentional, defect-related interfacial barriers and associated band bending.

An exemplary implementation of embodiment 200" may be a pixel detector provided by device structure 211" formed by readout wafer 210" with optional Si layer stack 215" covalently bonded to optionally thinned sensor wafer 220'" with optional layer stack 225'". Thinned sensor wafer 220'" may be obtained for example by low temperature wafer splitting of upper surface of wafer 220" which is implanted with hydrogen before the bonding (see for example I. P. Ferain et al. in J. Appl. Phys. 107, 054315 (2010), the entire disclosure of which is hereby incorporated by reference). After wafer splitting, thin bonded wafer 220" may be subjected to optional chemical mechanical polishing to planarize lower surface 223". Alternatively, thinned wafer 220'" may be obtained by removing substrate 242" in case that wafer 220" is an epitaxial wafer. Optional layer stacks 215" and 225'" are preferably low doped (highly resistive) with the exception of layer 223" which may act as an electric contact layer. Low doping may permit layer stacks 215", 225" to be substantially depleted of free carriers when a sufficient voltage is applied between layer 223" and charge collectors 219". Electric charges generated by radiation incident on sensor layer stack 225'" may thereby cross stack 225', bonded interface 234" and stack 215" by drift to be collected by charge collectors 219".

In another exemplary implementation of embodiment 200" may be a pixel detector 211'" formed by additionally patterning layer stacks 215", 225", 225'" after covalent bonding and optional thinning of layer stack 225". Therein pixels 232" are formed by etching through layer stack 225", 225'" of wafer 220", bonded interface 234" and layer stack 215" of wafer 210" such that pixels become electrically isolated. Charge collectors directly communicate with layer 261" which in this case may be highly doped. Pixel detector 211" may for example include an avalanche region in readout wafer 210" formed by layer stack 215" which in this case may consist of highly n-doped Si layer 261", intrinsic Si multiplication layer 262" and p-doped Si charge layer 263" in order to multiply the signal generated by photons in layer stack 225", 225'". The fabrication of pixel detector 211" is made compatible with a readout made by standard CMOS processing of wafer 210" because sensor layer stack 225", 225'" communicates with the readout by means of wafer bond 230" formed at temperatures well below customary substrate temperatures needed for direct epitaxial growth of a sensor layer. Covalent bonding may for example be carried out at room temperature or in a temperature range between room temperature and 300° C. When pixel detector 211" is used for near-infrared imaging, sensor layer stack 225", 225'" may for example be made up of heavily p-doped Ge-layer 223" and intrinsic (undoped) Ge absorption layer 221" (see for example J. Michel et al. in Nature Photonics 4, 527 (2010), the entire disclosure of which is hereby incorporated by reference). Localized states at bonded interface 234" are passivated preferably by hydrogen to be electrically inactive, thereby ensuring unimpeded flow of charges generated by light impinging on absorption layer 221" into avalanche region 262" of readout wafer 210" in which they are multiplied. Another suitable sensor wafer may consist of layer stack 225", 225'" having an intrinsic $In_xGa_{1-x}As$ absorber layer 221" on top of a heavily p-doped $In_xGa_{1-x}As$ contact layer 223". Preferably, the In content x is kept below about 0.2 in order to avoid large band offsets at bonded interface 234" which might impede carrier flow across that interface. Furthermore, low in contents are preferred in order to grow InGaAs epitaxially on a GaAs substrate 242" which may be removed after forming covalent bond 230". Other material combinations preferably comprising direct-gap semiconductors for absorption layer 221" may be suitable for infrared, visible, ultraviolet or soft X-ray imaging, such as GaAs, InP and alloys thereof, as well as for example CdTe and $Cd_{1-x}Zn_xTe$ which can be grown epitaxially for example on InSb substrates 242", which in turn can be removed after bond 230" has been formed.

In other implementations of embodiment 200", readout wafer stack 215" may consist of a single doped Si layer 261" communicating with charge collectors 219", whereby the avalanche multiplication layer is absent. Sensor wafer stack 225", 225'" may in turn be made up of, for example, one additional doped layer giving rise to a p-i-n configuration wherein any semiconductors suitable for infrared, visible or ultraviolet imaging may be used, taken for example from a list of suitable semiconductors including $Si_{1-x}Ge_x$ with $0 \leq x \leq 1$, GaAs, InP, $In_xGa_{1-x}As$ with $0<x \leq 1$, $In_xGa_{1-x}As_{1-y}P_y$ with $0<x \leq 1$ and $0<y \leq 1$, CdTe, $Cd_{1-x}Zn_xTe$ with $0<x \leq 1$, $Hg_xCd_{1-x}Te$, SiC and diamond.

Referring now to FIG. 3A, embodiment 300, 311, 311' of realizing direct, oxide-free wafer bonding for charge transport across bonded interface 334, unimpeded by traps, recombination centers or unintentional, defect-related interfacial barriers and associated band bending may include steps of (1) providing wafer 310 with upper surface 314 and lower surface 318, (2) planarizing lower surface 318 for example by grinding and chemical mechanical polishing, thereby optionally reducing the thickness of wafer 310 to a large extent after optionally bonding a handling wafer for example in an oxide-to-oxide bond onto upper surface 314. Planarization and handling wafer bonding may optionally be omitted when wafer 310 is an epitaxial wafer comprising at least one epitaxial layer on lower surface 318, (3) implanting hydrogen atoms 354 to an average depth (for instance, between 200-500 nm or preferably 100-200 nm, or, more preferably between 10-100 nm or even 1-10 nm) 356 in implantation step 350, (4) cleaning wafer 310 to render lower surface 318 particle-free to act as a first surface for covalent bonding, (5) removing the oxide on lower surface 318 for example by wet chemical or dry etching or a combination of the two, (6) providing wafer 320 with upper surface 324 and lower surface 328, (7) planarizing upper surface 324 for example by grinding and chemical mechanical polishing after optionally bonding a handling wafer for example in an oxide-to-oxide bond onto lower surface 328. Planarization and handling wafer bonding may optionally be omitted when wafer 320 is an epitaxial wafer comprising at least one epitaxial layer on upper surface 324 (8) cleaning wafer 320 to render upper surface 324 particle-free to act as a second surface for covalent bonding, (9) bonding lower surface 318 of wafer 310 to upper surface 324 of wafer 320 by oxide-free, low temperature covalent bond 330, (10) letting implanted hydrogen atoms 354 diffuse towards interface 334 by annealing at very low temperature (in a range for example between 100 and 400 degrees Celsius or preferably between 200 and 300 degrees Celcius) in order to passivate any point defects 358, such as traps and recombination centers formed for example by dangling bonds, and to eliminate any unintentional interfacial potential barriers and associated band bending induced by such point defects. Dislocations present as a result of inevitable wafer twist and tilt (see for example T. Akatsu et al. in J. Mat. Sci. 39, 3031 (2004), the entire disclosure of which is hereby incorporated by reference) may likewise be passivated by hydrogen diffusing into their cores (see for example A. Loshachenko et al. in Phys. Stat. Sol. C 10, 36 (2013), the entire disclosure of which is hereby incorporated by reference).

The order of steps (3)-(5) may be interchanged depending on particular needs depending, for example, where and how the hydrogen implantation step is carried out. The implantation of hydrogen in step (3) may be realized for example by a low energy hydrogen plasma generated by a low voltage arc discharge or an inductively coupled radio frequency plasma discharge. Arc discharge plasmas with high discharge currents up to 100 A and low voltages of 20-35 V are known for example in low temperature plasma cleaning of Si wafers by which the surface oxide may be removed and correspond approximately to ion energies around 20 eV or less incident on lower surface 318 of wafer 310 (see for example U.S. Pat. No. 5,308,950, the entire disclosure of which is hereby incorporated by reference). Ion energies on the order of 20 eV can be realized easily with the inductively coupled Copra DN250 CF plasma source from CCR Technology (www.ccrtechnology.de/products.php). For an arc discharge current of 30 A and voltage of 30 V and excessive plasma exposure, hydrogen has for example been observed to a depth of 200 nm below the Si surface (see for example J. Ramm et al. in Thin Solid Films 228, 23 (1993), the entire disclosure of which is hereby incorporated by reference). Both these plasma sources can be attached to the activation module of a bonding system in which they may also be used for dry etching of the oxide or for the elimination of surface hydrogen by sputtering. In this mode of operation step (4) comes before step (3) and may optionally be combined with wet chemical removal and hydrogen passivation of surface 318 before wafer 310 is inserted into the high vacuum bonding tool.

Low energy implantation of hydrogen in the range from 20 eV to 20 keV is for example also offered by ion beam services in F-13790 Peynier-France (www.ion-beam-services.com). This process is carried out outside the bonding tool and the sequence of steps (3)-(5) may be carried out in the normal way.

In order to avoid surfaces becoming hydrophobic during the exposure to a low energy hydrogen containing plasma when the implantation is performed inside the bonding tool, it may be preferable to switch off the hydrogen towards the end of the implantation step and expose the surface for example to a pure He plasma. For the purpose of interfacial defect passivation the dose of hydrogen atom implants 354 is preferably kept low, depending on the number of dangling bonds at interface 334. The lowest dose may be used when only a network of dislocations is present at the interface. For example a dose in the range of $10^{11}$-$10^{12}$ at/$cm^2$ or $10^{12}$-$10^{13}$ at/$cm^2$ or $10^{13}$-$10^{14}$ at/$cm^2$ may be sufficient in this case. Depending on their thickness, amorphous interlayers may require somewhat higher doses to be passivated, for example $10^{14}$-$10^{15}$ at/$cm^2$ or even $10^{15}$-$10^{20}$ at/$cm^2$. It is, however, preferable in any case to use a dose low enough to prevent bubble formation during implantation (see for example A. Dommann et al. in J. Phys. D: Appl. Phys. 28, A144-A148 (1995), the entire disclosure of which is hereby incorporated by reference), or in the subsequent low temperature post-bonding anneal (see for example Q.-Y. Tong et al. in Appl. Phys. Lett. 64, 625 (1994), the entire disclosure of which is hereby incorporated by reference).

Annealing temperatures for the post-bonding anneal required for the hydrogen diffusion towards the bonded interface may be in the range of 100-150° C. for annealing times of about one day, or preferably about 150-200° C. for annealing times on the order of one hour, or 200-300° C. for annealing by a few minutes, or 300-400° C. for annealing by about one minute.

Referring now to FIG. 3B, embodiment 300, 311", 311''' of realizing direct, oxide-free wafer bonding for charge transport across bonded interface 334', unimpeded by traps, recombination centers or unintentional, defect-related interfacial barriers and associated band bending may include the steps of (1) providing wafer 310' with upper surface 314' and lower surface 318', (2) planarizing lower surface 318' for example by grinding and chemical mechanical polishing, thereby optionally reducing the thickness of wafer 310' to a large extent after optionally bonding a handling wafer for example in an oxide-to-oxide bond onto upper surface 314'. Planarization and handling wafer bonding may optionally be omitted when wafer 310' is an epitaxial wafer comprising at least one epitaxial layer on lower surface 318', (3) implanting hydrogen atoms 354' to an average depth (for instance, between 200-500 nm or 100-200 nm, or, more preferably between 10-100 nm or even 1-10 nm) 356' in implantation step 350', (4) cleaning wafer 310' to render lower surface 318' particle-free to act as a first surface for covalent bonding for example by wet chemical or dry etching or a combination of the two, (5) removing the oxide on lower surface 318', (6) providing wafer 320' with upper surface 324' and lower surface 328', (7) planarizing upper surface 324' for example by grinding and chemical mechanical polishing after optionally bonding a handling wafer for example in an oxide-to-oxide bond onto lower surface 328'. Planarization and handling wafer bonding may optionally be omitted when wafer 320' is an epitaxial wafer comprising at least one epitaxial layer on upper surface 324', (8) implanting hydrogen atoms 354" to an average depth (for example, between 200-500 rm or 100-200 nm, or, more preferably between 10-100 nm or even 1-10 nm) 356" in implantation step 350", (9) cleaning wafer 320' to render upper surface 324' particle-free to act as a second surface for covalent bonding, (10) removing the oxide on upper surface 324', (11) bonding lower surface 318' of wafer 310' to upper surface 324' of wafer 320' by oxide-free, low temperature covalent bond 330', (10) letting implanted hydrogen atoms 354', 354" diffuse towards bonded interface 334' by annealing at very low temperature in order to passivate any point defects 358', such as traps and recombination centers formed for example by dangling bonds, and to eliminate any unintentional interfacial potential barriers and associated band bending induced by such point defects. Dislocations present as a result of inevitable wafer twist and tilt (see for example T. Akatsu et al. in J. Mat. Sci. 39, 3031 (2004), the entire disclosure of which is hereby incorporated by reference) may likewise be passivated by hydrogen diffusing into their cores (see for example A. Loshachenko et al. in Phys. Stat. Sol. C 10, 36 (2013), the entire disclosure of which is hereby incorporated by reference).

Implantation and annealing steps may for example be carried out in ways similar to the ones described in embodiment 300.

Figure 4:
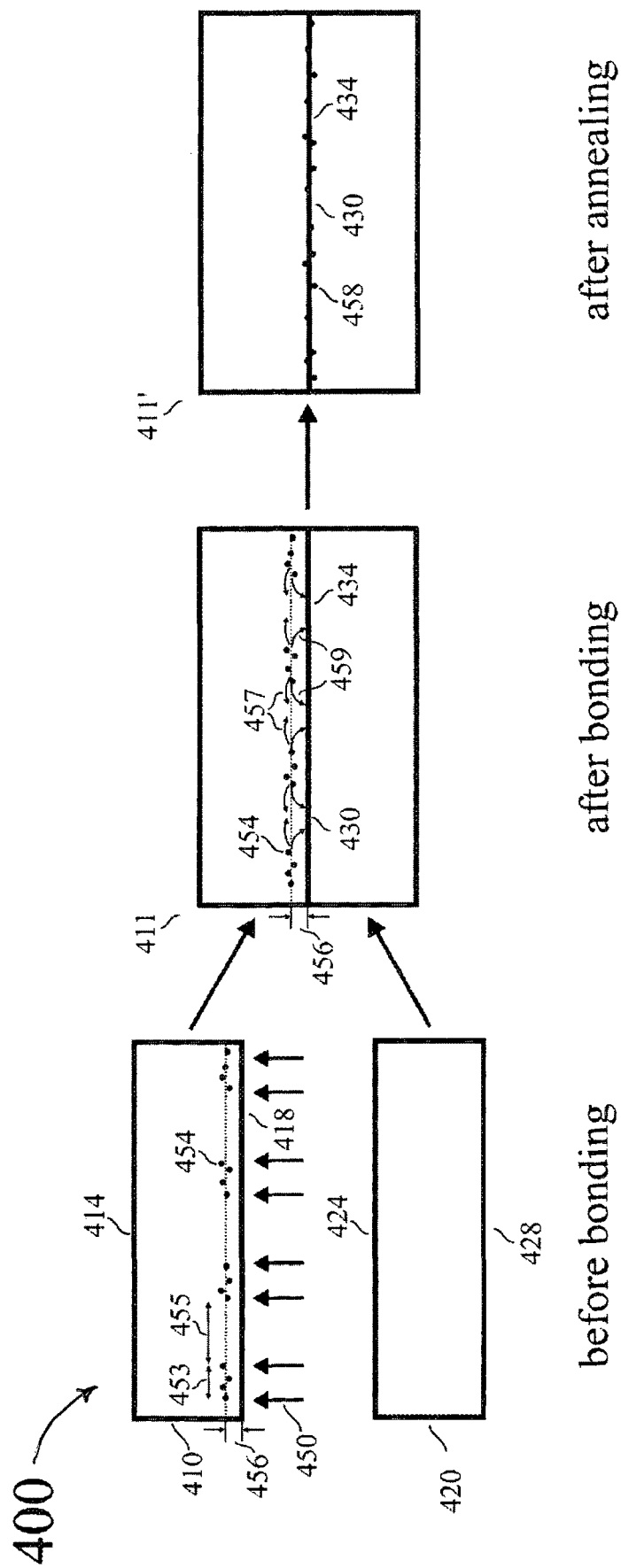
FIG. 4 is a graph showing a wafer with a selective hydrogen implant through a mask and a second wafer, before and after low temperature, oxide-free wafer bonding followed by a low temperature anneal.

Referring now to FIG. 4, embodiment 400, 411, 411' of realizing direct, oxide-free wafer bonding for charge transport across bonded interface 434, unimpeded by traps, recombination centers or unintentional, defect-related interfacial barriers and associated band bending may include the steps of (1) providing wafer 410 with upper surface 414 and lower surface 418, (2) planarizing lower surface 418 for example by grinding and chemical mechanical polishing, thereby optionally reducing the thickness of wafer 410 to a large extent after optionally bonding a handling wafer for example in an oxide-to-oxide bond onto upper surface 414. Planarization and handling wafer bonding may optionally be omitted when wafer 410 is an epitaxial wafer comprising at least one epitaxial layer on lower surface 418, (3) cleaning wafer 410 to render lower surface 418 particle-free to act as a first bonding surface, (4) removing the oxide on lower surface 418 for example by wet chemical or dry etching or a combination of the two, (5) selectively implanting hydrogen atoms 454 in implantation step 450 for example through a mask in the form of patches of width 453 spaced by distances 455 to an average depth (for instance, between 200-500 nm or 100-200 nm, or, more preferably between 10-100 nm or even 1-10 nm) 456, (6) providing wafer 420 with upper surface 424 and lower surface 428, (7) planarizing upper surface 424 for example by grinding and chemical mechanical polishing, thereby optionally reducing the thickness of wafer 420 to a large extent after optionally bonding a handling wafer for example in an oxide-to-oxide bond onto lower surface 428. Planarization and handling wafer bonding may optionally be omitted when wafer 420 is an epitaxial wafer comprising at least one epitaxial layer on upper surface 424, (8) cleaning wafer 420 to render upper surface 424 particle-free to act as a second bonding surface, (9) bonding lower surface 418 of wafer 410 to upper surface 424 of wafer 420 by oxide-free, low temperature covalent bond 430, (10) letting implanted hydrogen atoms 454 diffuse laterally 457, parallel to interface 434, and vertically 459 by annealing at very low temperature in order to passivate any point defects 458 at interface 434, such as traps and recombination centers formed for example by dangling bonds, and to eliminate any unintentional interfacial potential barriers and associated band bending induced by such point defects. Dislocations present as a result of inevitable wafer twist and tilt (see for example T. Akatsu et al. in J. Mat. Sci. 39, 3031 (2004), the entire disclosure of which is hereby incorporated by reference) may likewise be passivated by hydrogen diffusing into their cores (see for example A. Loshachenko et al. in Phys. Stat. Sol. C 10, 36 (2013), the entire disclosure of which is hereby incorporated by reference).

Implantation and annealing steps may for example be carried out in ways similar to the ones described in embodiment 300.

Figure 5:
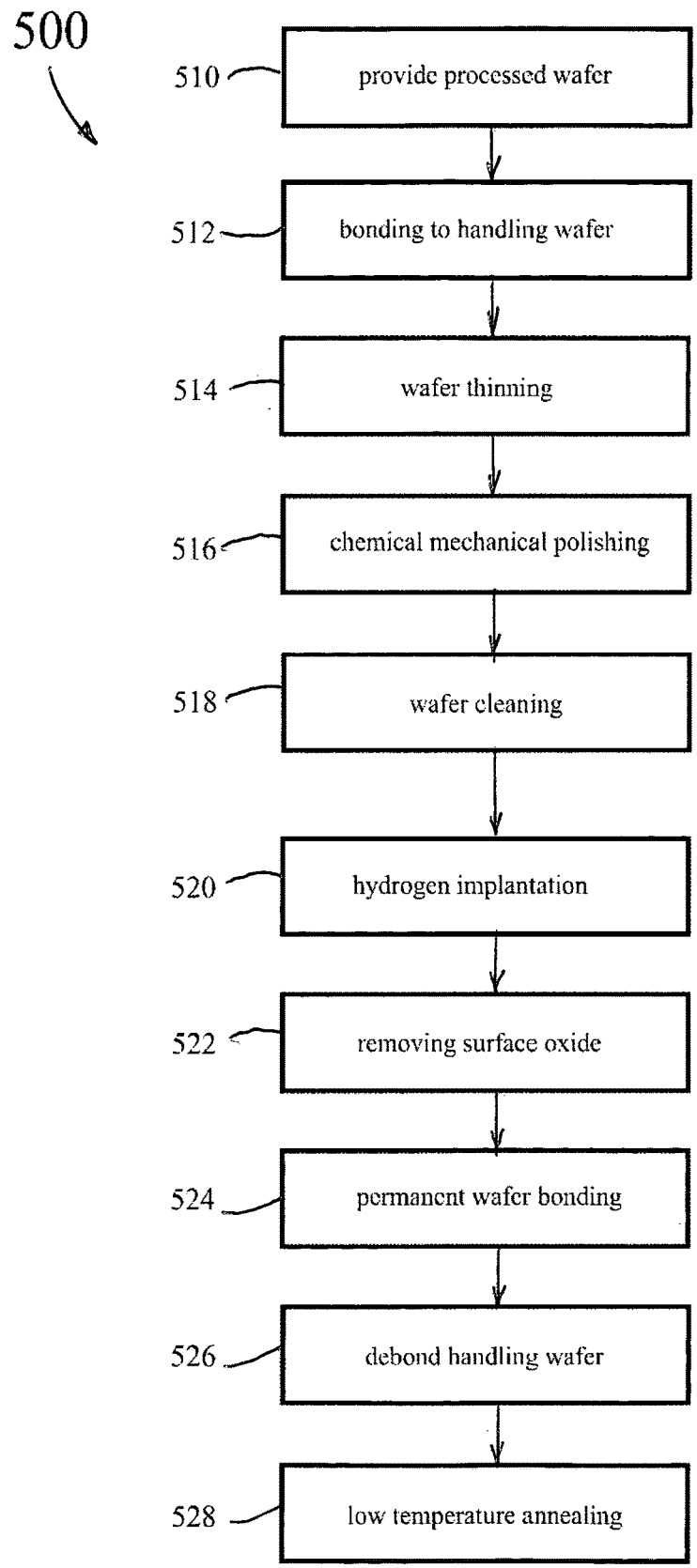
FIG. 5 is graph showing a schematic process flow for covalent wafer bonding without forming defect-related potential barriers.

Referring now to FIG. 5, process flow 500 of wafer bonding may include the following steps: 510 providing a wafer which may optionally have undergone device processing, 512 optionally providing a bond of the optionally device processed wafer to a handling wafer which may be a temporary bond for example by means of a glue or polymer interlayer or a permanent bond such as an oxide-to-oxide bond, 514 thinning the optionally device processed wafer for example to a thickness of 50-200 µm or 20-50 µm or preferably even of 10-20 µm, 516 optional chemical mechanical polishing of the optionally thinned wafer to provide a surface roughness within 0.5-1 nm or even within 0.2-0.5 nm, 518 removing particulate contamination from the wafer surface for example by wet chemical cleaning to make the surface suitable for covalent bonding, 520 providing a shallow hydrogen implant, for example to an average depth of preferably 100-200 nm or 200-500 nm, or even more preferably 1-10 nm or 10-100 nm in a low energy plasma, 522 removing the surface oxide from the optionally thinned wafer for example by wet chemical etching or by plasma etching, 524 wafer bonding to a wafer which has optionally undergone any one of steps 510-522 in a permanent, oxide-free covalent wafer bond, 526 optionally debonding the handling wafers, and 528 low temperature annealing of permanently bonded wafers, preferably within a temperature range of 100-150° C. for example for one days, or 150-200° C. for one hour, or 200-300° C. for 15 min, or at most 300-400° C. for 2 min, i.e. for a period of time long enough to cause diffusion of implanted hydrogen to the bonded interface and passivate traps and recombination centers, and to eliminate unintentional barriers and associated band bending impeding the efficient collection of charge carriers crossing the bonded interface.

Optionally, the order of some of steps 510 to 528 may be interchanged, such as for example step 518 and step 520, or step 520 and step 522. Furthermore, steps 520 and 522 may be combined, for example when surface oxides are removed in a plasma etching step, wherein hydrogen is admixed to the discharge gas which may for example be comprised of argon. Since it is undesirable to bond hydrophobic surfaces, it may be preferable to remove any hydrogen from the wafer surface. This can be achieved for example by switching off the hydrogen in the discharge gas, or, more efficiently, to change the discharge gas for example to He and making use of recoil implantation based on the knock-on effect, by means of which hydrogen may be driven from the surface to the interior of the wafer (see for example M. R. Tesauro et al. in Surf. Sci. 415, 37 (1998), the entire disclosure of which is hereby incorporated by reference).

Sputter removal of surface hydrogen, for example by He, combined with recoil implantation may also be used for example for the preparation of clean, hydrophilic Si surfaces after their hydrogen passivation by a dilute HF dip. Alternatively, a mixed He/H plasma may be used for the efficient removal of surface hydrogen combined with recoil implantation, preferably followed by a pure He-plasma step to assure hydrophilic surfaces.

Figure 6A:
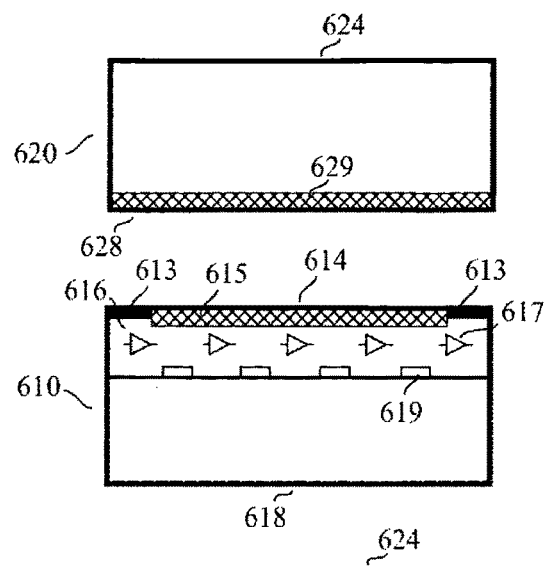
FIG. 6A is a graph showing a handling wafer and a processed wafer with electronic circuits before wafer bonding.

Referring now to FIG. 6A-6D, embodiment 600 of realizing direct, oxide-free covalent bonding of at least one thinned wafer for charge transport across a bonded interface, unimpeded by traps, recombination centers or unintentional, defect-related interfacial barriers and band bending may include the following further steps, each made up of a multitude of sub-steps:

(1) Providing wafer 610 with upper surface 614 and lower surface 618 which may optionally have been edge-trimmed and cleaned as known in the art (see for example J. Burggraf et al. in ECS Transactions 64, 95 (2014), the entire disclosure of which is hereby incorporated by reference). Wafer 610 may optionally be a processed wafer for example with integrated electric circuits 616 comprising devices 617 connected by metal lines which may be arranged in various metallization and dielectric layers on upper surface 614, and optional charge collectors 619 which may be communicating with electric circuits 616. Surface 614 may also include metal pads 613 communicating with electric circuits 616 and providing electrical connections to the outside world when contacted in a suitable way (see for example FIG. 6D), which may be isolated by regions of field oxide 615 as known in the art. Surface 614 may have been planarized for example by depositing an oxide layer and a subsequent chemical mechanical polishing step. Furthermore providing handling wafer 620 with upper surface 624 and lower surface 628 which may include surface oxide 629 (FIG. 6A).

Figure 6B:
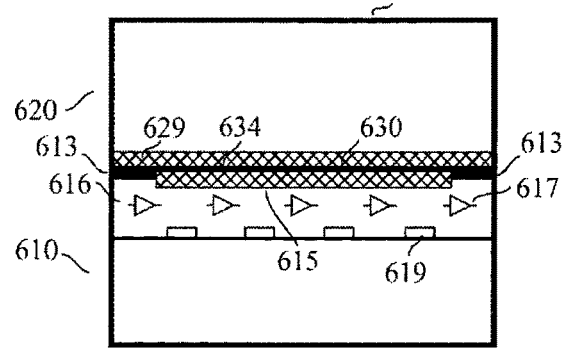
FIG. 6B is a graph showing a handling wafer permanently bonded to a processed wafer with electronic circuits.

(2) Providing strong bond 630 between wafer 610 and handling wafer 620 which may be a permanent bond, not requiring any glue, formed after activating surfaces 614 and 628 for example in a plasma activation step (see for example T. Plach et al. in J. Appl. Phys. 113, 094905 (2013), the entire disclosure of which is hereby incorporated by reference). Permanent wafer bond 630 may be a fusion bond, and bonded interface 634 between wafer 620 and handling wafer 610 may substantially be an oxide-oxide interface (FIG. 6B). Permanent wafer bond 630 may also be subjected to an optional low temperature post-bonding anneal, preferably within a temperature range of 100-150° C., or 150-200° C., or 200-300° C. to increase its bonding strength.

Figure 6C:
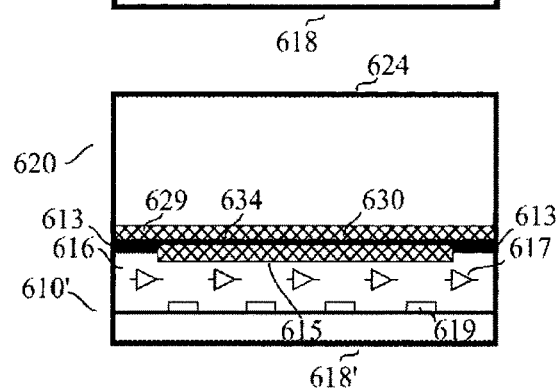
FIG. 6C is a graph showing a thinned processed wafer with electronic circuits permanently bonded to a handling wafer.

(3) Thinning wafer 610 for example to a thickness of 50-200 µm or 20-50 µm or preferably even of 10-20 µm by grinding, and providing smooth lower surface 618' with a roughness within 0.5-1 nm or even within 0.2-0.5 nm by chemical mechanical polishing, and removing particulate contamination from surface 618' of thinned wafer 610' for example by wet chemical cleaning to make the surface suitable for bonding (FIG. 6C). Optionally providing a shallow hydrogen implant to surface 618', for example to an average depth of preferably 200-500 nm or 100-200 nm, or more preferably 10-100 nm or even 1-10 nm.

Figure 6D:
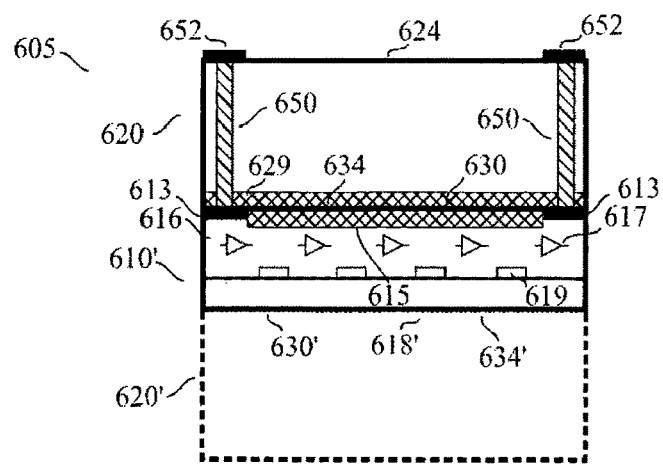
FIG. 6D is a graph showing a thinned processed wafer permanently bonded to a handling wafer after contacting the electronic circuits with through-silicon-vias.

(4) Removing the oxide from surface 618' by wet chemical etching or by plasma etching, and bonding surface 618' of thinned wafer 610', bonded to handling wafer 620, to wafer 620' which may optionally have undergone any one of steps (1)-(3) or parts of steps (1)-(3) in permanent, oxide-free covalent wafer bond 630' giving rise to wafer stack 605. Wafer stack 605 may be optionally annealed, preferably within a temperature range of 100-150° C., or 150-200° C., or 200-300° C., or at most 300-400° C. for a time long enough to cause diffusion of implanted hydrogen to bonded interface 634' and passivate traps and recombination centers, and to eliminate unintentional barriers and associated band bending impeding the efficient collection of charge carriers crossing bonded interface 634'. In an aspect of the embodiment handling wafer 620 with permanent bond 630 to optionally processed wafer 610, the wafer may be thinned and windows opened through thinned wafer 620 and oxide layer 629 to permit contact pads to be accessed and connected for example to a printed circuit board by means of wire or bump bonds for communication with the outside world. In another aspect of the embodiment handling wafer 620 with permanent bond 630 may be provided with silicon-through-vias (TSVs) 650 providing electrical contacts to metal pads 613 (FIG. 6D). Contact pads 652 communicating with TSVs 650 may furthermore communicate with the outside world, for example through a printed circuit board (PCB). In a further aspect of the embodiment wherein there is no need to keep wafer stack 605 mechanically stabilized by handling wafer 620, handling wafer 620 may be entirely removed for example by grinding or etching to expose interface 634 of permanent bond 630 and allow any additional process steps to be carried out on surface 614 of wafer 610. Wafer 620' may equally undergo additional processing steps, such as thinning for example by exfoliation (see for example I. P. Ferain et al. in J. Appl. Phys. 107, 054315 (2010), the entire disclosure of which is hereby incorporated by reference) or by substrate removal if wafer 620' is an epitaxial wafer.

Exemplary Applications of Oxide-Free, Passivated Bonded Wafer Interfaces

The bonded wafers of the present invention are integrated into and used in methods of the following applications as described below.

High Efficiency Compound Semiconductor Solar Cells on Si Substrates

The bonded wafer approach of the invention is used in multiple-junction solar cells, wherein stacks of compound semiconductor layers are bonded onto Si substrates in an oxide-free, electrically conducting covalent bond. These highly efficient solar cells on light-weight, mechanically stable Si substrates may be used for example for space applications or for terrestrial solar cells, wherein the high thermal conductivity of Si wafers facilitates the fabrication of heat sinks.

Integration of Photonic Devices with Si CMOS

The bonded wafer approach of the invention is also used in systems combining opto-electronic and photonic functionalities with highly integrated electronic CMOS circuits. It allows for example the stable operation of III-V compound semiconductor lasers integrated together with other opto-electronic devices, such as opto-couplers, switches, modulators and waveguides with fully processed Si CMOS wafers.

High-Resolution, High-Efficiency Imaging Detector Example

The bonded wafer approach of the invention is used in systems and methods for elementary particle and electromagnetic radiation detection and high resolution imaging. The systems and methods permit the efficient collection of charges generated within absorber wafers bonded to CMOS processed readout wafers because charge transport across hydrogen-passivated oxide-free covalent bonded interfaces is unimpeded by interfacial traps, recombination centers and unintentionally introduced potential barriers and band bending.

The pixel detectors have an excellent spatial resolution, unaffected by undesired scattering at the bonded interfaces, and single particle as well as single photon detection capability because of the collection of all charge pulses incident on the bonded interface. Pixel detectors for electromagnetic radiation detectors cover a large range from the infrared, visible, ultraviolet, soft X-ray to hard X-ray spectral region, depending on the kind of absorber layer stack covalently bonded to the readout wafer. They optionally permit charge multiplication for low energy radiation by means of avalanche regions incorporated in the readout wafer.

The following US patent documents, foreign patent documents, and Additional Publications are incorporated herein by reference thereto, as if fully set forth herein, and relied upon:

| US patent documents | |
| --- | --- |
| 6,787,885 B2 | September 2004 Esser et al. |
| 5,308,950 | May 1994 Ramm et al. |
| 2006/0021565 A1 | February 2006 Zahler et al. |
| Other patent documents | |
| WO 2016/097850 | December 2015 von Känel |

PUBLICATIONS

J. W. Matthews et al., "Accommodation of misfit across the interface between crystals of semiconducting elements or compounds", Journal of Applied Physics 41, 3800 (1970)

K. Tanabe et al., "III-V/Si hybrid photonic devices by direct fusion bonding", Scientific Reports 2, 349 (2012)

A. Talneau et al., "Atomic-plane-thick reconstruction across the interface during heteroepitaxial bonding of InP-clad quantum wells on silicon", Applied Physics Letters 102, 212101 (2013)

H. Takagi et al., "Transmission electron microscope observations of Si/Si interface bonded at room temperature by Ar beam surface activation", Japanese Journal of Applied Physics 38, 1589-1594 (1999)

M. M. R. Howlader et al., "Investigation of the bonding strength and interface current of p-Si/n-GaAs wafers bonded by surface activated bonding at room temperature", Journal of Vacuum Science and Technology B 19, 2114-2118 (2001)

C. Flötgen et al., "Novel surface preparation methods for covalent and conductive bonded interfaces fabrication", ECS Transactions 64, 103-110 (2014)

S. Bengtsson et al., "Interface charge control of directly bonded silicon structures", Journal of Applied Physics 66, 1231-1239 (1989)

G. W. Trucks et al., "Mechanism of HF etching of silicon surfaces: A theoretical understanding of hydrogen passivation", Physical Review Letters 65, 504-507 (1990)

A. Dommann et al., "X-ray curve characterization of homo-epitaxial layers on silicon deposited after DC hydrogen cleaning", Journal of Physics D: Applied Physics 28, A144-A148 (1995)

Q.-Y. Tong et al., "Hydrophobic silicon wafer bonding", Applied Physics Letters 64, 625-627 (1994)

P. Gupta et al., "Hydrogen desorption kinetics from monohydride and dihydride species on silicon surfaces", Physical Review B 37, 8234-8243 (1988)

A. M. Fecioru et al., "Silicon layer transfer by hydrogen implantation combined with wafer bonding in ultrahigh vacuum", Applied Physics Letters 89, 192109 (2006)

M. R. Tesauro et al., "Removal of hydrogen from 2H::Si (100) by sputtering and recoil implantation: investigation of an RPCVD growth mechanism", Surface Science 415, 37-47 (1998)

A. Reznicek et al., "Comparative TEM study of bonded silicon/silicon interfaces fabricated by hydrophilic, hydrophobic and UHV wafer bonding", Materials Chemistry and Physics 81, 277-280 (2003)

T. Akatsu et al., "Dislocation structure in low-angle interfaces between bonded Si(001) wafers", Journal of Material Science 39, 3031-3039 (2004)

J. I. Pankove et al., "Amorphous silicon as a passivant for crystalline silicon", Applied Physics Letters 34, 156-157 (1979)

A. Loshachenko et al., "Impact of hydrogen on electrical levels and luminescence of dislocation network at the interface of hydrophilically bonded silicon wafers", Physica Status Solidi C 10, 36-39 (2013)

T. Jiang et al., "Hydrogenation of interface states at a clean grain boundary in the direct silicon bonded wafer", Physica Status Solidi A 209, 990-993 (2012)

S. Dimitrijev et al., "Advances in SiC power MOSFET technology", Microelectronics Reliability 43, 225-233 (2003)

R. Pengelly et al., "A review of GaN on SiC high electron-mobility power transistors and MMICs", IEEE Transactions on Microwave Theory and Techniques 60, 1764-1783 (2012)

I. P. Ferain et al., "Low temperature exfoliation process in hydrogen-implanted germanium layers", J. Appl. Phys. 107, 054315 (2010)

J. Michel et al., "High-performance Ge-on-Si photodetectors", Nature Photonics 4, 527-534 (2010)

www.ccrtechnology.de

J. Ramm et al., "Hydrogen cleaning of silicon wafers. Investigation of the wafer surface after plasma treatment", Thin Solid Films 228, 23-26 (1993)

J. Burggraf et al., "Monolithic thin wafer stacking using low temperature direct bonding", ECS Transactions 64, 95-101 (2014)

T. Plach et al., "Mechanisms for room temperature direct wafer bonding", Journal of Applied Physics 113, 094905 (2013)

www.ion-beam-services.com

The patents and articles mentioned above are hereby incorporated by reference herein, unless otherwise noted, to the extent that the same are not inconsistent with this disclosure.

Other characteristics and modes of execution of the invention are described in the appended claims.

Further, the invention should be considered as comprising all possible combinations of every feature described in the instant specification, appended claims, and/or drawing figures which may be considered new, inventive and industrially applicable.

Multiple variations and modifications are possible in the embodiments of the invention described here. Although certain illustrative embodiments of the invention have been shown and described here, a wide range of modifications, changes, and substitutions is contemplated in the foregoing disclosure. While the above description contains many specifics, these should not be construed as limitations on the scope of the invention, but rather as exemplifications of one or another preferred embodiment thereof. In some instances, some features of the present invention may be employed without a corresponding use of the other features. Accordingly, it is appropriate that the foregoing description be construed broadly and understood as being given by way of illustration and example only, the spirit and scope of the invention being limited only by the claims which ultimately issue in this application.

What is claimed is:

1. A CMOS compatible method of forming a covalently bonded wafer pair comprising an oxide-free covalently bonded interface between two semiconductor wafers at which traps and recombination centers are passivated by hydrogen, the method comprising the steps of:
   a. providing at least one bonding surface of each semiconductor wafer with a surface roughness low enough for wafer bonding by chemical mechanical polishing, wherein the surface roughness is within a range of surface roughness chosen from one of the list of ranges of surface roughnesses consisting of 0.5-1 nm and 0.2-0.5 nm,
   b. creating a shallow low dose hydrogen implant in at least one bonding surface of the at least one of the two semiconductor wafers before bonding, wherein a depth of the shallow implant is within a depth range chosen from one of the list of depth ranges, consisting of 100-200 nm and 10-100 nm, and wherein the low dose is chosen from one of the list of low doses consisting of $10^{11}$-$10^{12}$ at/cm$^2$, $10^{12}$-$10^{13}$ at/cm$^2$, $10^{13}$-$10^{14}$ at/cm$^2$, $10^{14}$-$10^{15}$ at/cm$^2$ and $10^{15}$-$10^{16}$ at/cm$^2$,
   c. removing the surface oxide from the bonding surfaces and then subjecting the bonding surfaces to a cleaning step, thereby providing clean bonding surfaces suitable for covalent wafer bonding,
   d. low temperature bonding the bonding surfaces of the two semiconductor wafers in a covalent, oxide-free wafer bond at suitable temperatures below 300° C. to form the covalently bonded wafer pair comprising the oxide-free covalently bonded interface between the two semiconductor wafers, and
   e. annealing the covalently bonded wafer pair at a suitable low temperature, thereby letting the implanted hydrogen diffuse to the covalently bonded interface and passivate traps and recombination centers, thereby eliminating defect-induced interfacial potential barriers hindering the unimpeded flow of electric current across the covalently bonded interface.

2. The method of claim 1, wherein forming said covalently bonded wafer pair comprises a step of providing at least one of the two semiconductor wafers with electrical devices.

3. The method of claim 1, wherein forming said covalently bonded wafer pair comprises a step of providing at least one of the two semiconductor wafers as a CMOS processed silicon wafer comprising integrated circuits.

4. The method of claim 1, wherein forming said covalently bonded wafer pair comprises choosing at least one of the semiconductor wafers to be made of at least one material selected from the group consisting of Si; $Si_{1-x}Ge_x$, wherein $0<x\le1$; SiC; GaAs; InP; $In_xGa_{1-x}As$ wherein $0<x\le1$; $In_xGa_{1-x}As_{1-y}P_y$ wherein $0<x\le1$ and $0<y\le1$; CdTe; and $Cd_{1-x}Zn_xTe$ wherein $0<x\le1$.

5. A covalently bonded wafer pair formed by a covalent wafer bond between two semiconductor wafers, comprising a covalently bonded interface which is oxide-free and free from defect-related carrier scattering and from defects causing potential barriers and band bending, and wherein electric currents can cross said interface unaffected by traps and recombination centers in the presence of an electric field, wherein the covalently bonded wafer pair is formed by the method of claim 1.

6. The covalently bonded wafer pair of claim 5, wherein at least one of the semiconductor wafers is a processed wafer comprising electrical devices.

7. The covalently bonded wafer pair of claim 5, wherein at least one of the processed wafers is a CMOS processed silicon wafer comprising integrated circuits.

8. The covalently bonded wafer pair of claim 5, wherein at least one of the semiconductor wafers comprises at least one material selected from the group consisting of Si; $Si_{1-x}Ge_x$, wherein $0<x\le1$; SiC; GaAs; InP; $In_xGa_{1-x}As$ wherein $0<x\le1$; $In_xGa_{1-x}As_{1-y}P_y$ wherein $0<x\le1$ and $0<y\le1$; CdTe; and $Cd_{1-x}Zn_xTe$ wherein $0<x\le1$.

9. A solar cell comprising the covalently bonded wafer pair of claim 5.

10. The solar cell of claim 8, wherein the covalently bonded wafer pair comprises a silicon wafer bonded to wafer comprising at least one semiconductor material selected from the group consisting of Si; SiC; $Si_{1-x}Ge_x$, wherein $0<x\le1$; GaAs; InP; $In_xGa_{1-x}As$ wherein $0<x\le1$; and $In_xGa_{1-x}As_{1-y}P_y$ wherein $0<x\le1$ and $0<y\le1$.

11. A system combining opto-electronic and photonic functionalities comprising the covalently bonded wafer pair of claim 5.

12. The system of claim 11, wherein the covalently bonded wafer pair comprises a processed Si CMOS wafer bonded to a III-V compound semiconductor wafer.

13. A pixel detector comprising the covalently bonded wafer pair of claim 5.

14. The pixel detector of claim 13, wherein the covalently bonded wafer pair comprises an absorber wafer bonded to a CMOS processed readout wafer.

15. The pixel detector of claim 14, wherein electric charges generated in the absorber wafer are capable of crossing the covalently bonded interface unaffected by interfacial traps, recombination centers and defect-related potential barriers to be collected by charge collectors communicating with CMOS processed readout circuits.

16. The pixel detector of claim 14 adapted to detection and imaging of electromagnetic radiation.

17. The pixel detector of claim 16 adapted to detection and imaging of infrared radiation.

18. The pixel detector of claim 16 adapted to detection and imaging of visible radiation.

19. The pixel detector of claim 16 adapted to detection and imaging of ultraviolet radiation.

20. The pixel detector of claim 16, wherein the detection and imaging of electromagnetic radiation is by absorption and electric electrical charges generated by absorption of electromagnetic radiation are multiplied by avalanche multiplication.

21. The pixel detector of claim 13 adapted to detection and imaging of electromagnetic radiation.

22. The pixel detector of claim 21 wherein the electromagnetic radiation is infrared radiation.

23. The pixel detector of claim 21 wherein the electromagnetic radiation is visible radiation.

24. The pixel detector of claim 21 wherein the electromagnetic radiation is ultraviolet radiation.

25. The pixel detector of claim 21, wherein the detection and imaging of electromagnetic radiation is by absorption and electric charges generated by absorption of electromagnetic radiation are multiplied by avalanche multiplication.

26. A method of forming at least one covalently bonded wafer pair comprising steps of:
   a. providing at least one first semiconductor wafer bonded to a handling wafer, and at least one second wafer with a bonding surface suitable for covalent wafer bonding;

b. thinning the at least one first semiconductor wafer to a thickness within a thickness range chosen from one of the list of thickness ranges consisting of
50-200 µm
20-50 µm, and
10-20 µm;
thereby providing at least one first thinned semiconductor wafer;
c. subjecting a bonding surface of the at least one first thinned semiconductor wafer to a chemical mechanical polishing step;
d. implanting the bonding surface of the at least one first thinned and/or the at least one second semiconductor wafer with a shallow hydrogen implant;
e. removing the surface oxides from the bonding surfaces of the at least one first thinned and/or the at least one second semiconductor wafer;
f. subjecting bonding surfaces which have had surface oxides removed to a cleaning step, thereby providing a clean bonding surface suitable for covalent wafer bonding;
g. permanently bonding at least the bonding surfaces of the at least one first thinned and the at least one second semiconductor wafers in a covalent, oxide-free wafer bond, thereby providing at least one covalently bonded wafer pair with at least one covalently bonded interface; and
h. annealing the at least one covalently bonded wafer pair at low temperatures to let implanted hydrogen diffuse to the at least one covalently bonded interface and passivate traps and recombination centers, thereby eliminating defect-induced interfacial potential barriers which hinder the unimpeded flow of electric current across the at least one covalently bonded interface.

27. The method of claim 26, wherein forming said at least one covalently bonded wafer pair comprises debonding of the handling wafer.

28. A method of forming at least one covalently bonded wafer pair comprising steps of:
a. providing at least one first semiconductor wafer with a permanent bond to a handling wafer, and at least one second semiconductor wafer with a clean bonding surface suitable for covalent wafer bonding,
b. thinning the at least one first semiconductor wafer bonded to the handling wafer to a thickness within a thickness range chosen from one of the list of thickness ranges consisting of
50-200 µm
20-50 µm, and
10-20 µm,
thereby providing at least one first thinned semiconductor wafer;
c. subjecting a bonding surface of the at least one first thinned semiconductor wafer to a chemical mechanical polishing step;
d. implanting the bonding surface of the at least one first thinned and/or the at least one second semiconductor wafer with a shallow hydrogen implant;
e. removing the surface oxides from the bonding surfaces of the at least one first thinned and/or the at least one second semiconductor wafer;
f. subjecting bonding surfaces which have had surface oxides removed to a cleaning step, thereby providing a clean bonding surface suitable for covalent wafer bonding;
g. permanently bonding at least the bonding surfaces of the at least one first thinned and the at least one second semiconductor wafers in a covalent, oxide-free wafer bond, thereby providing at least one covalently bonded wafer pair with at least one covalently bonded interface; and
h. annealing the at least one covalently bonded wafer pair at low temperatures to let implanted hydrogen diffuse to the at least one covalently bonded interface and passivate traps and recombination centers, thereby eliminating defect-induced interfacial potential barriers which hinder the unimpeded flow of electric current across the at least one covalently bonded interface.

29. The method of claim 28 wherein forming said at least one covalently bonded wafer pair comprises steps of providing silicon-through-vias in the handling wafer to contact metal pads communicating with electrical circuits, and of providing metal pads communicating with silicon-through-vias and with other devices.

* * * * *